United States Patent
Tsuji et al.

(10) Patent No.: US 10,206,287 B2
(45) Date of Patent: Feb. 12, 2019

(54) METHOD FOR MANUFACTURING CIRCUIT BOARD AND CIRCUIT BOARD

(71) Applicant: TOYO ALUMINIUM KABUSHIKI KAISHA, Osaka-shi, Osaka (JP)

(72) Inventors: Kosuke Tsuji, Osaka (JP); Kazunori Koike, Osaka (JP); Katsura Kawashima, Osaka (JP); Kenju Tsuchiya, Itami (JP); Shinji Imai, Itami (JP)

(73) Assignee: TOYO ALUMINIUM KABUSHIKI KAISHA, Osaka-Shi, Osaka (JP)

( * ) Notice: Subject to any disclaimer, the term of this patent is extended or adjusted under 35 U.S.C. 154(b) by 55 days.

(21) Appl. No.: 15/039,949

(22) PCT Filed: Nov. 28, 2014

(86) PCT No.: PCT/JP2014/081541
§ 371 (c)(1),
(2) Date: May 27, 2016

(87) PCT Pub. No.: WO2015/080245
PCT Pub. Date: Jun. 4, 2015

(65) Prior Publication Data
US 2017/0034920 A1 Feb. 2, 2017

(30) Foreign Application Priority Data
Nov. 28, 2013 (JP) .................. 2013-246414

(51) Int. Cl.
*H05K 1/09* (2006.01)
*H05K 3/06* (2006.01)
*C23F 1/20* (2006.01)
*H05K 1/03* (2006.01)
*H05K 3/44* (2006.01)

(52) U.S. Cl.
CPC ............... *H05K 3/067* (2013.01); *C23F 1/20* (2013.01); *H05K 1/032* (2013.01); *H05K 1/092* (2013.01);
(Continued)

(58) Field of Classification Search
CPC ........ H05K 3/067; H05K 1/032; H05K 1/092; H05K 3/061; H05K 3/44; H05K 2203/0384; H05K 2203/0502; C23F 1/20
See application file for complete search history.

(56) References Cited

U.S. PATENT DOCUMENTS 6,069,065 A * 5/2000 Arimoto ................. H01L 24/11
257/E21.508
6,162,366 A 12/2000 Ishikura et al.
(Continued)

FOREIGN PATENT DOCUMENTS

EP 0937691 A1 8/1999
EP 1713094 A2 10/2006
(Continued)

OTHER PUBLICATIONS

JP English translation JP2010-278410.*
Japanese Notice of Grounds of Rejection for Japanese Application No. 2015-551011, dated Sep. 11, 2018, with English translation.

*Primary Examiner* — Steven T Sawyer
(74) *Attorney, Agent, or Firm* — Birch, Stewart, Kolasch & Birch, LLP

(57) ABSTRACT

The present invention relates to a method for manufacturing a circuit board including the steps of preparing a substrate containing silicon at least at a surface, applying a paste containing aluminum particles onto the substrate, forming a conductor layer on the substrate by firing the substrate to which the paste has been applied, forming a resist film having a specific pattern on the conductor layer, and removing with an etchant, the conductor layer in a portion where
(Continued)

the resist film has not been formed, the etchant containing fluoride ions and metal ions of a metal M of which standard electrode potential is higher in value than a standard electrode potential of aluminum, and to a circuit board which can be manufactured with such a method.

4 Claims, 3 Drawing Sheets

(52) U.S. Cl.
CPC ............... *H05K 3/061* (2013.01); *H05K 3/44* (2013.01); *H05K 2203/0384* (2013.01); *H05K 2203/0502* (2013.01)

(56) References Cited

U.S. PATENT DOCUMENTS

| | | |
|---|---|---|
| 6,258,294 B1 | 7/2001 | Johnson, II et al. |
| 6,379,569 B1 | 4/2002 | Rouberol |
| 2011/0297873 A1 | 12/2011 | Kuroiwa et al. |
| 2012/0064291 A1 | 3/2012 | Lai et al. |
| 2012/0103414 A1* | 5/2012 | Ishibashi ............... H01B 1/22 136/256 |
| 2013/0034923 A1 | 2/2013 | Kim et al. |
| 2014/0339288 A1* | 11/2014 | Otaki .................... B23K 20/04 228/117 |

FOREIGN PATENT DOCUMENTS

| | | |
|---|---|---|
| EP | 2 241 653 A1 | 10/2010 |
| EP | 2405449 A1 | 1/2012 |
| JP | 8-46331 A | 2/1996 |
| JP | 11-158660 A | 6/1999 |
| JP | 2000-104183 A | 4/2000 |
| JP | 2004-235503 A | 8/2004 |
| JP | 2010-199121 A | 9/2010 |
| JP | 2010-278410 A | 12/2010 |
| JP | 2012-72441 A | 4/2012 |
| WO | WO 2010/100893 A1 | 9/2010 |

* cited by examiner

METHOD FOR MANUFACTURING CIRCUIT BOARD AND CIRCUIT BOARD

TECHNICAL FIELD

The present invention relates to a method for manufacturing a circuit board and a circuit board.

BACKGROUND ART

Various methods for manufacturing a ceramic circuit board are available, and improvement for lower cost, higher precision, and higher reliability has been sought. Conventionally, for such a ceramic circuit board, gold, silver, copper, or aluminum has been selected as a material for a conductor layer, and a method using a metal foil or a metal paste, PVD (sputtering or vacuum vapor deposition), or CVD has been adopted as a method for forming a conductor layer. A method of etching a conductor layer or a method of printing a paste in a form of a circuit has been adopted as a method for forming a conductor layer in a circuit pattern.

In forming a conductor layer, since PVD or CVD is a vacuum process, it is disadvantageous in high cost and insufficient adhesiveness. In using a metal foil, an adhesive should be used for fixing a metal foil to a ceramic substrate, and deterioration thereof tends to be disadvantageous in terms of long-term stability.

In using a metal paste, such a precious metal as gold, silver, or copper has mainly generally been used, however, cost thereof is high. In addition, migration in a case of silver or increase in resistance value due to oxidation in a case of copper is disadvantageous.

As one of methods for solving the problems in using a metal paste, WO2010/100893 (hereinafter PTD 1) has proposed a method using an aluminum paste.

A specific method of forming a conductor layer by using a metal paste includes a method of printing a metal paste in a form of a circuit and a method of applying a metal paste all over a surface, firing the metal paste to thereby obtain a conductor layer, and thereafter etching the conductor layer. It has been known, however, that etching allows formation of a circuit with higher precision than printing in a form of a circuit because of printability or because of absence of influence by a particle size of metal particles in the metal paste.

In order to provide adhesiveness to a substrate in obtaining a conductor layer by firing the metal paste, generally, glass frit containing silicon is added to the paste and the paste is fired, to thereby obtain a conductor layer containing silicon.

In common etching, however, it is difficult to completely remove the conductor layer containing silicon from the surface of the substrate. Therefore, the conductor layer containing silicon remains as a residue also in an etched portion and reliability in insulation between interconnections may be lowered. As a method of removing the residue of the conductor layer, as shown in Japanese Patent Laying-Open No. 2010-278410 (hereinafter PTD 2), a method of subjecting the etched portion to sandblast treatment has been proposed.

CITATION LIST

Patent Document

PTD 1: WO2010/100893
PTD 2: Japanese Patent Laying-Open No. 2010-278410

SUMMARY OF INVENTION

Technical Problem

When a method of adding glass frit containing silicon to a paste is adopted as a method of providing adhesiveness between a substrate and a conductor layer, glass containing silicon representing an insulator is contained in the conductor layer, and hence such performance as conductivity of the conductor layer may deteriorate.

When sandblast treatment is adopted as a method of removing a residue of the conductor layer containing silicon, precision of a circuit is impaired due to restriction of a particle size of an abrasive, and hence an advantage of etching allowing formation of a circuit with high precision is lost. Namely, when such a fine interconnection that a distance between lines (conductor/insulator/conductor) is, for example, smaller than 100 µm is formed by performing sandblast treatment, a particle size of an abrasive used for the sandblast treatment should be small. When the particle size is too small, grinding performance is insufficient, and it becomes difficult to remove the residue after etching. In addition, after grinding with sandblasting, a step of removing the abrasive which adheres to the substrate is also required, which leads to increase in number of steps and resultant high cost.

As set forth above, a method for manufacturing a circuit board achieving both of high adhesiveness between the substrate and a conductor layer and easy removal of a residue after etching while an advantage of a method by etching allowing formation of a circuit with high precision is made use of, and a circuit board having adhesiveness between the substrate and the conductor layer and excellent reliability in insulation between interconnections, which can be manufactured with such a method, have not yet been known.

The present invention was made in view of the circumstances as above, and an object thereof is to provide a method for manufacturing a circuit board achieving both of high adhesiveness between the substrate and a conductor layer and easy removal of a residue after etching while an advantage of a method by etching allowing formation of a circuit with high precision is made use of, and a circuit board having adhesiveness between the substrate and a conductor layer and excellent reliability in insulation between interconnections.

Solution to Problem

The present inventors have found that, in order to achieve the object to facilitate removal of a conductor layer which remains as a residue with a common etching method and to allow formation of a highly fine interconnection, a substrate containing silicon at least at a surface should be employed, aluminum particles should be employed as a metal to be contained in a metal paste, and an etchant should contain fluoride ions and metal ions of a metal M of which standard electrode potential is higher in value than a standard electrode potential of aluminum, and completed the present invention.

Namely, the present invention is directed to a method for manufacturing a circuit board including the steps of preparing a substrate containing silicon at least at a surface, applying a paste containing aluminum particles onto the substrate, forming a conductor layer on the substrate by firing the substrate to which the paste has been applied, forming a resist film having a specific pattern on the conductor layer, and removing with an etchant, the conductor layer in a portion where the resist film has not been formed, the etchant containing fluoride ions and metal ions of metal M of which standard electrode potential is higher in value than a standard electrode potential of aluminum.

Here, the metal ions may be iron ions or copper ions, and the fluoride ions may be derived from at least one compound selected from the group consisting of hydrogen fluoride, tetrafluorosilicon, hexafluorosilicic acid, hexafluorosilicate, boron trifluoride, fluoroboric acid, fluoroborate, phosphorus fluoride, ammonium fluoride, silver fluoride, aluminum fluoride, cesium fluoride, potassium fluoride, sodium fluoride, and lithium fluoride.

The etchant may contain 0.01 to 10 mass % of the fluoride ions.

The present invention is directed to a circuit board including a substrate containing silicon at least at a surface, a conductor layer containing aluminum, which is formed on the substrate, and a mixed layer in which aluminum derived from the conductor layer and silicon are present as being mixed, which is formed at an interface between the substrate and the conductor layer, the substrate having a portion where the conductor layer has partially been removed such that the conductor layer forms a specific interconnection pattern on the substrate, and in a cross-section in a direction perpendicular to the substrate, a ratio between a peak intensity found in energy dispersive X-ray analysis (hereinafter also referred to as EDS analysis) of an aluminum element derived from the conductor layer and a peak intensity found in energy dispersive X-ray analysis of a silicon element (a peak intensity of an aluminum element/a peak intensity of a silicon element) in a surface region of the substrate in the portion where the conductor layer has partially been removed being not more than one tenth.

When the substrate contains an aluminum element, a numeric value calculated by subtracting the peak intensity of the aluminum element derived from the substrate from the peak intensity of the aluminum element in a result of analysis can be handled as the peak intensity of the aluminum element derived from the conductor layer.

Advantageous Effects of Invention

The method for manufacturing a circuit board according to the present invention exhibits an excellent effect that both of high adhesiveness between a substrate and a conductor layer and easy removal of a residue are achieved after etching while an advantage of a method by etching allowing formation of a circuit with high precision is made use of.

Therefore, a circuit board obtained with the manufacturing method according to the present invention is a circuit board suitable for capability to mount multiple chips and high-density mount.

Namely, the circuit board according to the present invention has high adhesiveness between the substrate and the conductor layer and excellent reliability in insulation between interconnections.

DESCRIPTION OF EMBODIMENTS

The present invention will be described hereinafter in further detail.

<Method for Manufacturing Circuit Board>

A method for manufacturing a circuit board according to the present invention includes the steps of preparing a substrate containing silicon at least at a surface, applying a paste containing aluminum particles onto the substrate, forming a conductor layer on the substrate by firing the substrate to which the paste has been applied, forming a resist film having a specific pattern on the conductor layer, and removing with an etchant, the conductor layer in a portion where the resist film has not been formed.

<Step of Preparing Substrate>

The method for manufacturing a circuit board according to the present invention includes the step of preparing a substrate containing silicon at least at a surface.

(Substrate)

Figure 1:
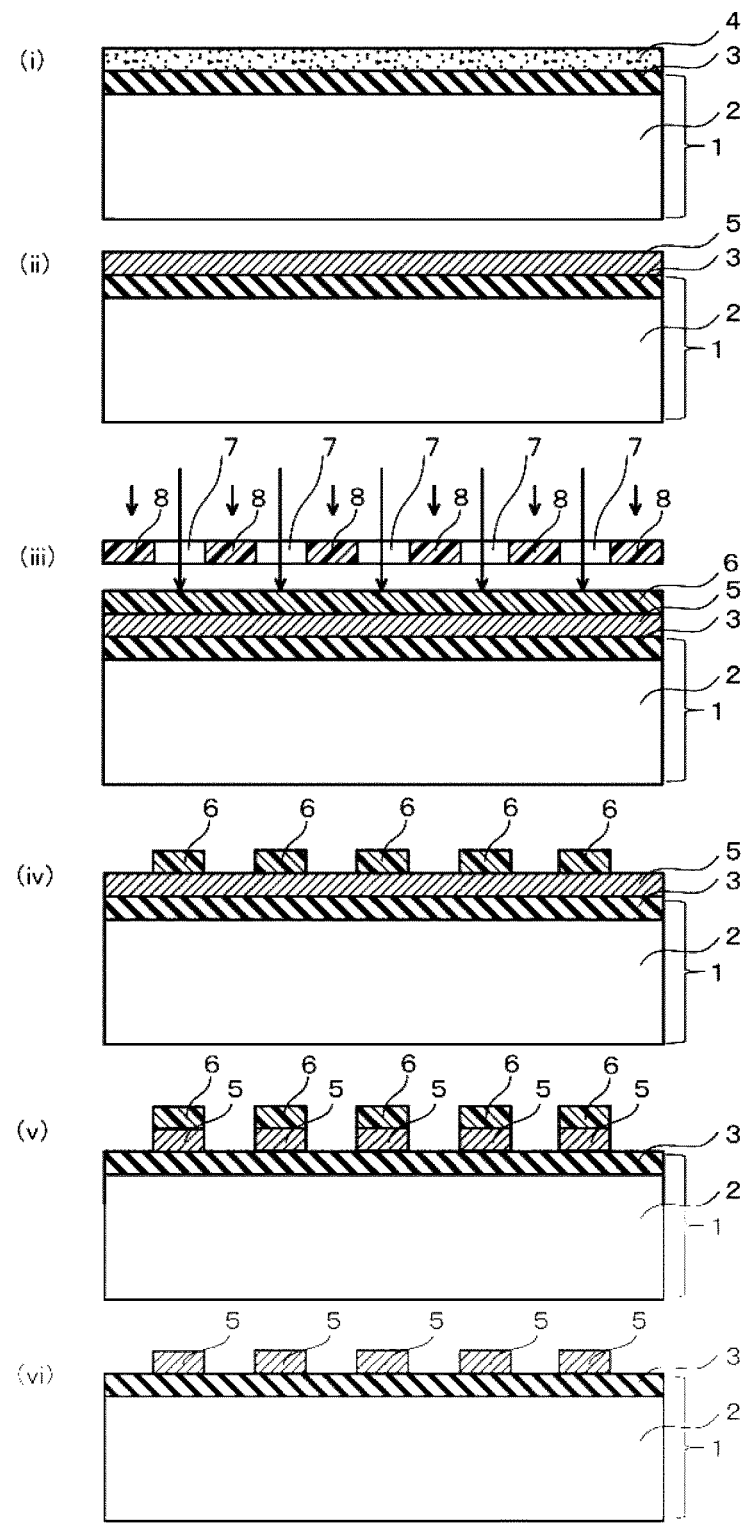
FIG. 1 is a cross-sectional view schematically showing steps in a method for manufacturing a circuit board according to the present invention.

As the substrate containing silicon at least at the surface, for example, a substrate obtained by coating a ceramic substrate 2 with a glass composition 3 containing silicon can be exemplified, as shown as a glass-ceramics composite substrate 1 in FIG. 1 (i). Here, though a material for the ceramic substrate is not particularly limited, alumina, aluminum nitride, and silicon carbide are given as examples. Though a material for the glass composition is not particularly limited so long as silicon is contained, borosilicate-based glass and alkaline earth silicate glass are given as examples. The glass-ceramics composite substrate can be formed, for example, by applying a glass paste to a surface of the ceramic substrate and firing the glass paste.

Though FIG. 1 exemplifies the glass-ceramics composite substrate as above as the substrate containing silicon at least at the surface, the substrate employed in the present invention is not limited only to this substrate. For example, so long as silicon is contained, a glass substrate can also be employed. Though a material for the glass substrate is not particularly limited, soda lime glass, aluminosilicate glass, and borosilicate glass are given as examples. When such a glass substrate is employed, silicon is contained in the entire substrate including the surface.

When a glass substrate is employed for the substrate containing silicon at least at the surface, the substrate can be transparent. When the glass-ceramics composite substrate is employed, surface smoothness or durability is obtained as compared with a substrate made of ceramics alone. Selection depending on an application can be made.

It is expected that the substrate employed in the present invention contains silicon at least at the surface as described above and hence a mixed layer with aluminum particles contained in a paste which will be described later is formed after firing. It is thus estimated that high adhesiveness is provided between the conductor layer and the substrate because the mixed layer containing aluminum and silicon is formed on the surface of the substrate.

<Step of Applying Paste>

The method for manufacturing a circuit board according to the present invention includes the step of applying a paste containing aluminum particles onto the substrate. This step is a step of applying a paste 4 containing aluminum particles onto glass-ceramics composite substrate 1, for example, as in FIG. 1 (i). The paste can be applied once or a plurality of times.

(Paste)

A paste containing at least aluminum particles and a solvent can be employed as the paste containing aluminum particles, which is employed in the present invention. For example, a paste composed of an organic liquid vehicle containing a solvent and aluminum particles can suitably be employed.

(1) Aluminum Particles

Aluminum particles are preferably flaky aluminum particles and have an average particle size preferably from 0.5 to 50 μm and more preferably from 0.5 to 20 μm. The "average particle size" in the present invention means an average particle size calculated based on volume average grain size distribution measured with a laser diffraction method. The average particle size is also called a median diameter (D50), and defined as such a particle size that particles greater and smaller than the average particle size are present in equal amounts. When the aluminum particles have a particle size smaller than 0.5 μm, a relative surface area of the aluminum particles increases and a viscosity of the paste is high. Then, it is less likely to obtain a viscosity suitable for printing. When the aluminum particles have an average particle size exceeding 50 μm, printability of a paste may lower.

A content of aluminum particles in the paste is preferably from 5 to 40 mass % and more preferably from 10 to 30 mass %. When the content is lower than 5 mass %, a portion where an amount of presence of aluminum is small tends to be created and conductivity may become poor. When the content exceeds 40 mass %, an amount of presence of aluminum is ensured, and hence there is no possibility of poor conductivity. A coating film made from the paste, however, becomes thick, and etching may become difficult.

(2) Organic Liquid Vehicle

Though a composition of an organic liquid vehicle contained in the paste employed in the present invention is not particularly limited, the organic liquid vehicle can contain a binder resin and a solvent.

A component of the binder resin is not particularly limited, and a resin such as an ethyl cellulose based resin, an alkyd based resin, a polyester based resin, and an acrylic resin can be employed. A binder resin as being completely burnt and decomposed at a firing temperature in heating and firing of the paste according to the present invention subsequent to application of the paste to the substrate is preferred.

Isopropyl alcohol, toluene, cyclohexanone, and a glycol ether based, glycol ester based, or terpineol based organic solvent can be employed as the solvent.

In the organic liquid vehicle, a content of a binder resin in a solvent is preferably from 5 to 40 mass %. When the composition of the organic liquid vehicle is within the range above, the paste employed in the method for manufacturing a circuit board according to the present invention is excellent in applicability or printability to various substrates.

Preferably, a content of the organic liquid vehicle in the paste as a whole is 60 to 95 mass %.

(3) Glass Frit

The paste employed in the present invention may or may not contain glass frit. Silicon is present at the surface of the substrate in the present invention. Therefore, even when glass frit is not necessarily contained in the paste, high adhesiveness can be provided between the substrate and the conductor layer when the conductor layer is formed from the paste by firing thereof in a subsequent step. When the conductor layer is free from an insulator derived from glass frit, such performance as conductivity or reliability is excellent. Therefore, preferably, glass frit is not contained in the paste.

(Application of Paste)

A method of applying a paste in the present invention is not particularly limited, and a paste can be applied to form a coating film by adopting a doctor blade method, a spray coating method, a screen printing method, and an ink jet method. Application may be performed once or a plurality of times. A portion to which a paste is to be applied is preferably the entire surface of the substrate. A case that there is a portion to which a paste is not applied, however, does not depart from the scope of the present invention. Though a suitable thickness of a coating film varies as appropriate depending on a method of application and a concentration of a solid content in a paste, it is preferably from 0.1 to 100 μm and more preferably from 0.2 to 5 μm. When the coating film is too thick, the coating film may not completely be removed by etching after firing, and erosion in a direction of a line width may occur before etching in a direction of thickness is completed. When a coating film is too thin, sufficient adhesiveness may not be provided between the conductor layer and the substrate when the coating film is fired to form the conductor layer.

(Drying and Degreasing)

After the paste is applied, drying and degreasing treatment may be performed as necessary. Though a condition for drying and degreasing treatment is not particularly limited, normally, a drying temperature is from 50° C. to 150° C. and a degreasing temperature is from 250° C. to 450° C. Though an atmosphere for drying and degreasing treatment is not particularly limited, the treatment is performed generally in air.

<Step of Forming Conductor Layer>

The method for manufacturing a circuit board according to the present invention includes the step of forming a conductor layer on the substrate by firing the substrate to which the paste has been applied. In the step of forming a conductor layer, for example, as in FIG. 1 (ii), conductor layer 5 is formed on the substrate by firing the substrate to which paste 4 has been applied. Namely, conductor layer 5 is formed by firing paste 4.

(Firing)

A method of firing a paste in the present invention is not particularly limited. Various firing furnaces can be used, and examples thereof include a batch firing furnace, a roller firing furnace, and a belt firing furnace. In terms of productivity, a firing furnace in which substrates to which a paste has been applied can successively be fired like the belt firing furnace is preferably used. A firing temperature is preferably from 400° C. to 850° C. and more preferably from 450° C. to 600° C. A time period for firing is not particularly limited, ranging from a short period to a long period, so long as a paste containing aluminum particles can form a conductor layer having conductivity after firing. In order to suppress formation of an oxide film of aluminum which will cause increase in resistance value, short-period firing is preferred.

An atmosphere for firing is not particularly limited, and a conductor layer exhibiting good conductivity and adhesiveness can be obtained in any firing atmosphere such as air, a non-oxidizing atmosphere, a reducing atmosphere, and vacuum. From a point of view of suppression of formation of an oxide film, a non-oxidizing atmosphere, a reducing atmosphere, or vacuum is more preferred. The "non-oxidizing atmosphere" refers to an atmosphere which does not contain oxygen, for example, an atmosphere containing any gas such as argon, helium, or nitrogen, or a mixed-gas atmosphere containing a plurality of types of these gases. A reducing atmosphere may be set by mixing a reducing gas such as a hydrogen gas with a gas for a non-oxidizing atmosphere.

(Conductor Layer)

Conductor layer 5 is formed, for example, by firing a paste applied onto a substrate as in FIG. 1 (ii). High adhesiveness is provided by firing, at an interface between the substrate and the conductor layer. Such a conductor layer has conductivity.

(1) Interface Between Substrate and Conductor Layer

The method for manufacturing a circuit board according to the present invention provides high adhesiveness between the substrate and the conductor layer by applying a paste onto the substrate containing silicon at least at the surface and firing the paste.

Though a reason why high adhesiveness can be provided by the method above is unclear, a reason below is possible. Namely, it is estimated that a mixed layer in which aluminum and silicon are present as being mixed is formed at the interface between the substrate containing silicon at least at the surface and the conductor layer.

<Step of Forming Resist Film>

The method for manufacturing a circuit board according to the present invention includes the step of forming a resist film having a specific pattern on the conductor layer. In this step, for example, as in FIGS. 1 (iii) and (iv), a resist film 6 having a specific pattern is formed on conductor layer 5 formed in the step of forming a conductor layer.

(Resist Film)

Resist film 6 among known resist films can be used without particularly being limited so long as a resist film is not eroded by an etchant for subsequently removing the conductor layer. For example, a commercially available resist film such as a dry film may be used, or a resist solution may be applied onto the conductor layer with such an application method as spin coating or roll coating and it may be formed into a resist film.

(Exposure and Development)

In a case of using a commercially available resist film such as a dry film or in a case of forming a resist solution into a resist film, a resist film having a specific pattern can be formed through a normal exposure and development process.

For example, a photomask 8 having an optically transparent portion 7 in a target specific interconnection pattern formed is prepared, and photomask 8 is layered on resist film 6, for example, as in FIG. 1 (iii), which is irradiated with prescribed light for curing the resist film such as ultraviolet rays. Thereafter, the resist film is subjected to development treatment with a developer, so that the resist film in a portion which has not been exposed to light is dissolved and the resist film having a specific pattern corresponding to the desired interconnection pattern is formed on the conductor layer, for example, as in FIG. 1 (iv).

Contact exposure and proximity exposure can be adopted for exposure, and a known developer can be used for development.

Though use of a negative type photomask has been described as a method of forming a resist film having a specific pattern in the description above and FIG. 1, the present invention is not limited as such. A positive photomask can also be used to form a resist film having a specific pattern with a normal exposure and development method.

<Step of Removing Conductor Layer with Etchant>

The method for manufacturing a circuit board according to the present invention includes the step of removing with an etchant, the conductor layer in a portion where the resist film has not been formed. In this step, conductor layer 5 in a portion where resist film 6 is not formed is removed with an etchant, for example, as in FIG. 1 (v), to thereby form the conductor layer in the desired interconnection pattern.

An etchant and an etching method used in this step will be described below.

(Etchant)

An etchant used in this step contains fluoride ions and metal ions of metal M (hereinafter also simply denoted as "metal ions") of which standard electrode potential is higher in value than a standard electrode potential of aluminum (1) Metal Ions Metal ions are ions of metal M of which standard electrode potential is higher in value than a standard electrode potential of aluminum. So long as ions are ions of metal M of which standard electrode potential is higher in value than a standard electrode potential of aluminum, a type thereof is not particularly limited. Therefore, as a difference in potential from aluminum is greater, an effect is higher, and examples of the metal include gold, platinum, silver, copper, lead, tin, nickel, iron, and zinc. In particular from a point of view of a price, iron and copper can suitably be employed. Though a valence of iron ions is not particularly limited, trivalent iron ions are preferred, because bivalent iron is readily oxidized by oxygen in air and handling is difficult in controlling a composition. Bivalent copper ions are preferred as copper ions, because bivalent copper salt is readily dissolved in water and stable in an aqueous solution. Examples of such iron ions and copper ions include those derived from at least one compound selected from the group consisting of ferric chloride, ferric nitrate, ferric sulfate, cupric chloride, cupric nitrate, and copper sulfate, however, limitation thereto is not intended. Here, "derived from a compound" means that the compound is contained in an etchant and generates metal ions.

A content of metal ions in an etchant is preferably from 5 to 30 mass % in terms of an etching rate and more preferably from 10 to 15 mass %, although depending on metal ions to be contained.

(2) Fluoride Ions

An etchant employed in the present invention contains fluoride ions together with the metal ions above.

Fluoride ions are preferably derived from at least one compound selected from the group consisting of hydrogen fluoride, tetrafluorosilicon, hexafluorosilicic acid, hexafluorosilicate, boron trifluoride, fluoroboric acid, fluoroborate, phosphorus fluoride, ammonium fluoride, silver fluoride, aluminum fluoride, cesium fluoride, potassium fluoride, sodium fluoride, and lithium fluoride. Here, "derived from a compound" means that the compound is contained in an etchant and generates fluoride ions as in the case of the metal ions. Ammonium fluoride is preferred as such a compound, because it is not as dangerous as hydrogen fluoride.

A content of fluoride ions in the etchant is preferably from 0.01 to 10 mass % and more preferably from 0.3 to 5 mass %. When the content of fluoride ions is lower than 0.01 mass %, a sufficient effect of removal of a reactant may not be obtained. When the content is higher than 10 mass %, corrosivity to a manufacturing apparatus or a substrate may be excessively high.

(3) Function

In a case that an aluminum foil is stacked on a substrate made of ceramics or the like by using an adhesive and a circuit is formed by etching the aluminum foil, etching can be performed if only the etchant contains the metal ions above without fluoride ions being contained. In forming a circuit by etching a conductor layer (a conductor layer formed by firing a paste containing aluminum particles) formed with the method for manufacturing a circuit board according to the present invention, however, a residue remains on the substrate also after etching even with the use of the etchant containing only metal ions, and etching as allowing obtainment of a circuit excellent in reliability in insulation cannot be achieved. Then, the etchant employed in the present invention contains metal ions and fluoride ions. Thus, a circuit can be formed without leaving a residue on a substrate.

Though a detailed function of such an etchant according to the present invention has not yet sufficiently been clarified, the present inventor assumes as follows.

Namely, though an oxide film is formed on a surface of an aluminum foil, no oxide film is formed inside the aluminum foil. Though an oxide of aluminum is less likely to be dissolved in an etchant containing only metal ions, the etchant containing only metal ions can dissolve only one layer of the oxide film on the surface of the aluminum foil. If only the oxide film is dissolved, aluminum inside the aluminum foil is readily dissolved by the etchant. Therefore, in etching an aluminum foil, etching can be achieved even by using the etchant containing only metal ions.

In etching a conductor layer formed by firing a paste containing aluminum particles as in the present invention, however, a large number of aluminum particles are present in the conductor layer as being layered on one another. An oxide film is present on a surface of each of the aluminum particles similarly to the surface of the aluminum foil. Therefore, a large number of oxide films as many as the aluminum particles are present in the conductor layer. Thus, it is estimated that the etchant containing only the metal ions above cannot dissolve all oxide films in the conductor layer and hence etching is incomplete.

In the present invention, it is expected that a mixed layer in which aluminum and silicon are present as being mixed is formed at the interface between the conductor layer and the substrate as described previously, and it may also be possible that the mixed layer may remain without being removed by the etchant containing only the metal ions above. The etchant employed in the present invention seems to exhibit a sufficient etching function also on such a mixed layer.

In etching the conductor layer with a solution containing only fluoride ions, corrosivity to a manufacturing apparatus, a substrate, or a resist film is excessively high, and hence etching as allowing obtainment of a desired high-precision circuit cannot be achieved.

The etchant employed in the present invention is thus estimated to (1) dissolve an oxide film on the surface of aluminum particles with the action of fluoride ions and to (2) thereafter dissolve aluminum in the aluminum particles with the action of the metal ions, to thereby be able to readily dissolve the conductor layer with repeated actions of (1) and (2) even though a large number of oxide films are layered in the conductor layer, and it is estimated that thereafter (3) the mixed layer can also readily be dissolved because the metal ions act on aluminum and fluoride ions act on silicon.

(Etching Method)

Though a specific method for removing the conductor layer in a portion where a resist film is not formed with an etchant is not particularly limited, a method of immersing the entire substrate into the etchant or a method of spraying the etchant can be adopted. By adopting the method as above, the conductor layer in a portion where a resist film is not formed can be removed with the etchant and the conductor layer can be formed into a desired interconnection pattern.

<Other Steps>

The method for manufacturing a circuit board according to the present invention may include any other steps so long as each step described above is included.

For example, after the step of removing the conductor layer with the etchant, a step of removing resist film 6 can be included. Through this step, for example, a circuit board as in FIG. 1 (vi) can be obtained.

Alternatively, a step of plating a formed conductor layer (a fine interconnection) with such a metal as gold or nickel for the purpose of soldering may be included.

<Circuit Board>

The circuit board according to the present invention includes a substrate containing silicon at least at a surface, a conductor layer containing aluminum, which is formed on the substrate, and a mixed layer in which aluminum and silicon are present as being mixed, which is formed at an interface between the substrate and the conductor layer, the substrate having a portion where the conductor layer has partially been removed such that the conductor layer forms a specific interconnection pattern on the substrate, and in a cross-section in a direction perpendicular to the substrate, a ratio between a peak intensity found in energy dispersive X-ray analysis of an aluminum element and a peak intensity found in energy dispersive X-ray analysis of a silicon element (a peak intensity of an aluminum element/a peak intensity of a silicon element) in a surface region of the substrate in the portion where the conductor layer has partially been removed being not more than one tenth. Such a circuit board can be fabricated with the method for manufacturing a circuit board described above.

The circuit board according to the present invention will be described below.

<Substrate>

The circuit board according to the present invention has a substrate containing silicon at least at a surface. A substrate the same as described in connection with the method for manufacturing a circuit board can be employed as the substrate containing silicon at the surface. Namely, for example, a substrate obtained by coating ceramic substrate 2 with glass composition 3 containing silicon as shown with glass-ceramics composite substrate 1 in FIG. 1 (vi) can be exemplified as the substrate containing silicon at the surface of the circuit board according to the present invention, and in addition, a glass substrate in which silicon is contained in the entire substrate including at least the surface can also be employed. It is estimated that, by employing the substrate containing silicon at the surface, the circuit board according to the present invention can have high adhesiveness between the conductor layer and the substrate because a mixed layer is formed between the substrate and the conductor layer which will be described later.

<Conductor Layer>

The circuit board according to the present invention has a conductor layer containing aluminum, which is formed on the substrate. It is estimated that, by including the conductor layer containing aluminum, the circuit board according to the present invention can have ensured conductivity of the conductor layer, and owing to formation of the mixed layer between the conductor layer and the substrate described previously, can have high adhesiveness between the conductor layer and the substrate. The conductor layer should only contain aluminum and have conductivity. In order to further improve conductivity, the conductor layer contains preferably 70 mass % or more and more preferably 90 mass % or more of aluminum. Though a thickness of the conductor layer is not particularly limited, for higher conductivity, the thickness is preferably from 0.1 μm to 100 μm and more preferably from 0.2 to 5 μm.

The conductor layer according to the present invention can be formed with a method the same as the method of forming a conductor layer set forth in the description of the method for manufacturing a circuit board. Namely, for example, as in FIGS. 1 (i) and (ii), conductor layer 5 can be formed by applying paste 4 containing aluminum particles onto substrate 1 and firing the paste.

<Mixed Layer>

The circuit board according to the present invention has a mixed layer formed at the interface between the substrate and the conductor layer, in which aluminum and silicon are present as being mixed. It is estimated that the circuit board according to the present invention has the mixed layer at the interface between the substrate and the conductor layer and therefore adhesiveness can be provided between the substrate and the conductor layer.

The mixed layer should only provide adhesiveness between the substrate and the conductor layer, with aluminum and silicon being present as being mixed therein. Though a thickness of the mixed layer is not particularly limited, for higher adhesiveness, the thickness is preferably from 0.005 μm to 10 μm and more preferably from 0.01 to 5 μm.

In order to check whether or not a mixed layer of aluminum and silicon is formed between the conductor layer and substrate, for example, change in concentration of aluminum and silicon at the interface between the conductor layer and the substrate should only be observed by conducting energy dispersive X-ray spectrometry using an electron microscope (a trade name "TITAN 80-300" manufactured by FEI Company) on a region including the conductor layer and the substrate in a cross-section in a direction perpendicular to the substrate. If presence by 5 nm or more of a region where a value for detection of aluminum is not less than one tenth of a value for detection of aluminum in the conductor layer and simultaneously a value for detection of silicon is not less than one tenth of a value for detection of silicon in the substrate is observed as a result of energy dispersive X-ray spectrometry, it can be determined that the mixed layer has been formed between the conductor layer and the substrate.

The mixed layer according to the present invention can be formed with a method the same as the method of forming a mixed layer set forth in the description of the method for manufacturing a circuit board. Namely, for example, as in FIGS. 1 (i) and (ii), it is estimated that a mixed layer (not shown) can be formed because silicon contained at the surface of the substrate and aluminum in aluminum particles contained in the paste are present as being mixed when conductor layer 5 containing aluminum is formed on substrate 1 by applying paste 4 containing aluminum particles onto substrate 1 containing silicon at least at the surface and firing the paste.

<Interconnection Pattern>

The substrate in the circuit board according to the present invention has a portion where the conductor layer has partially been removed such that the conductor layer forms a specific interconnection pattern on the substrate. The interconnection pattern of the conductor layer is not particularly limited, and a desired pattern should only be selected. In manufacturing of the circuit board according to the present invention, since an interconnection pattern can be formed by employing etching which allows high-precision formation of a circuit without performing an operation for removing a residue after etching through sandblast treatment, a high-precision interconnection pattern can be adopted. Though a width of an interconnection (a line width) and an interval between adjacent interconnections (a space) in the interconnection pattern of the present invention, that is, what is called line-and-space (L/S), are not particularly limited, in order to obtain a high-precision interconnection pattern, the width and the interval are preferably not greater than 100 μm, more preferably not greater than 60 μm, and further preferably not greater than 40 μm.

A method the same as the method of forming an interconnection pattern set forth in the description of the method for manufacturing a circuit board can be employed as the method of forming an interconnection pattern in the present invention. Namely, for example, as in FIG. 1 (iii) to (vi), the conductor layer can be formed into a desired interconnection pattern by forming resist film 6 having a specific pattern on conductor layer 5 and removing the conductor layer in a portion where the resist film is not formed with an etchant.

(Portion Where Conductor Layer Has Been Removed)

In the circuit board according to the present invention, in a cross-section in a direction perpendicular to the substrate, a ratio between a peak intensity found in energy dispersive X-ray analysis of an aluminum element derived from the conductor layer and a peak intensity found in energy dispersive X-ray analysis of a silicon element (a peak intensity of an aluminum element/a peak intensity of a silicon element) in a surface region of the substrate in the portion where the conductor layer has partially been removed (hereinafter also denoted as a "substrate surface region") is not more than one tenth.

The circuit board according to the present invention is estimated to have excellent reliability in insulation, because a ratio between a peak intensity found in energy dispersive X-ray analysis of an aluminum element derived from the conductor layer and a peak intensity found in energy dispersive X-ray analysis of a silicon element (a peak intensity of an aluminum element/a peak intensity of a silicon element) in the substrate surface region is not more than one tenth, and therefore the possibility that an electric current flows between the interconnections, between which insulation is intended, due to the presence of the aluminum element lowers.

Here, the "substrate surface region" means a region in the vicinity of the surface formed as a result of removal of the conductor layer, in a portion where the conductor layer has partially been removed such that the conductor layer forms a specific interconnection pattern on the substrate. Here, when a residue derived from the conductor layer remains on the surface of the substrate from which the conductor layer has partially been removed, this "substrate surface region" is defined as including that residue.

In the substrate surface region, preferably, the residue derived from the conductor layer and resulting from reaction with the etchant described previously and the mixed layer of aluminum and silicon do not remain. Therefore, an ideal content of the aluminum element in the substrate surface region is 0. In consideration of balance of industrial productivity, however, due to such a factor as a composition of an etchant and a time required for etching, the residue or the mixed layer described previously may not completely be removed by etching. In view of the above, the circuit board according to the present invention has a ratio between a peak intensity found in energy dispersive X-ray analysis of the aluminum element derived from the conductor layer and a peak intensity found in energy dispersive X-ray analysis of the silicon element (a peak intensity of the aluminum element/a peak intensity of the silicon element) in the substrate surface region not more than one tenth, and therefore an effect thereof that reliability in insulation between interconnections is excellent is not impaired.

The ratio between the peak intensity found in energy dispersive X-ray analysis of the aluminum element derived from the conductor layer and the peak intensity found in energy dispersive X-ray analysis of the silicon element (the peak intensity of the aluminum element/the peak intensity of the silicon element) in the substrate surface region being not more than one tenth can be achieved by the method of removing the conductor layer with the etchant in the method for manufacturing a circuit board according to the present invention, for example, the method of removing the conductor layer with the etchant containing fluoride ions and metal ions of metal M of which standard electrode potential is higher in value than a standard electrode potential of aluminum.

A ratio between the peak intensity found in energy dispersive X-ray analysis of the aluminum element derived from the conductor layer and the peak intensity found in energy dispersive X-ray analysis of the silicon element (the peak intensity of the aluminum element/the peak intensity of the silicon element) in the substrate surface region is preferably not more than 7/100, more preferably not more than 2/100, and further preferably not more than 1/100.

In order to check whether or not aluminum and silicon are present in the substrate surface region and to check a content thereof, for example, dispersive X-ray analysis using an energy dispersive X-ray analyzer "X-MAX" manufactured by Horiba Ltd. should only be conducted while the substrate surface region is subjected to image observation with an electron microscope.

In the circuit board according to the present invention, in addition to a peak intensity ratio, a content of the aluminum element in the substrate surface region is desirably not higher than 1000 ppm, more preferably not higher than 100 ppm, and further preferably not higher than 50 ppm. By setting such a numerical range, an effect of excellent reliability in insulation between interconnections is not impaired. When the substrate contains the aluminum element, a numeric value calculated by subtracting a content of the aluminum element derived from the substrate from a content of the aluminum element in a result of analysis can be handled as a content of the aluminum element derived from the conductor layer.

The circuit board according to the present invention is estimated to have high adhesiveness between the conductor layer and the substrate because the mixed layer formed at the interface between the substrate and the conductor layer, in which aluminum and silicon are present as being mixed, is present, and it is estimated to have excellent reliability in insulation because a ratio between the peak intensity found in energy dispersive X-ray analysis of the aluminum element derived from the conductor layer and the peak intensity found in energy dispersive X-ray analysis of the silicon element (the peak intensity of the aluminum element/the peak intensity of the silicon element) in the substrate surface region in the portion where the conductor layer has partially been removed in the cross-section in the direction perpendicular to the substrate is not more than one tenth. Therefore, the circuit board according to the present invention has high adhesiveness between the substrate and the conductor layer and excellent reliability in insulation between interconnections.

EXAMPLES

Though the present invention will be described below in further detail with reference to Examples, the present invention is not limited thereto.

Example 1

(Step of Preparing Substrate)

A soda lime glass substrate (a trade name "FL2" manufactured by Central Glass Co., Ltd.) was prepared as a substrate. This soda lime glass substrate is a substrate containing silicon in the entire substrate including a surface.

(Step of Applying Paste)

A paste was prepared by stirring 70 parts by mass of an organic liquid vehicle in which 10 parts by mass of ethyl cellulose had been dissolved in 90 parts by mass of butyl carbitol, 20 parts by mass of butyl carbitol, and 10 parts by mass of aluminum particles having an average particle size of 11 μm. Then, this paste was applied to the entire surface of the soda lime glass substrate with screen printing. After application, in order to eliminate surface irregularities of the paste, the soda lime glass substrate to which the paste had been applied was rested in a flat state for 10 minutes and dried at 100° C. for 10 minutes. The dried paste had a thickness of 5 μm.

<Step of Forming Conductor Layer>

The soda lime glass substrate to which the paste had been applied in the step above was fired under such a condition that it was heated to 550° C. in 60 minutes in atmosphere, held for 60 minutes at 550° C., and cooled to a room temperature in 30 minutes. The conductor layer was thus formed on the substrate.

(Step of Forming Resist Film)

A resist film having a specific pattern was formed on the conductor layer by bonding a photosensitive dry film (a trade name "ATP-153" manufactured by Asahi Kasei Corporation) onto the fired conductor layer as a resist film, conducting ultraviolet ray exposure with a photomask having a comb pattern of which line width/space between lines (hereinafter also denoted as "L/S") was 60 μm/40 μm being brought in contact with the resist film, and developing the photomask with an alkaline developer.

(Step of Removing Conductor Layer with Etchant and the Like)

A specific interconnection pattern was formed by using as an etchant, an etchant which was an aqueous solution containing 14 mass % of cupric chloride and 3 mass % of ammonium fluoride, that is, an etchant containing fluoride ions and metal ions of metal M (bivalent copper ions) of which standard electrode potential was higher in value than a standard electrode potential of aluminum, immersing a portion where a resist film was not formed in the etchant for 10 seconds at a room temperature, and removing the conductor layer with the etchant. Thereafter, the resist film on the conductor layer was removed with N-methyl pyrrolidone.

Figure 2:
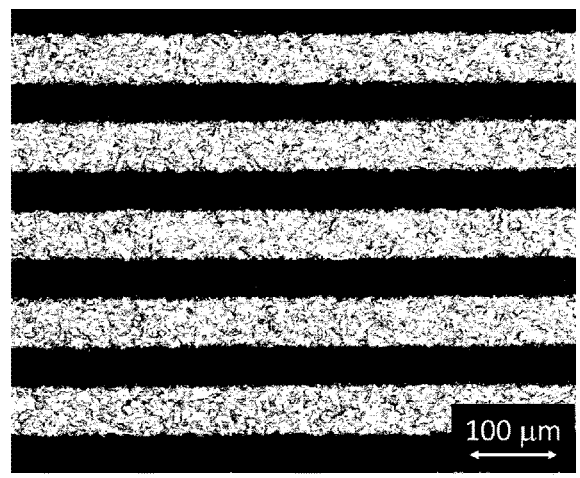
FIG. 2 is an optical micrograph of a surface of a conductor layer of the circuit board in Example 1.

Through the steps above, the conductor layer in the portion where the resist film had not been formed was removed with the etchant and the circuit board having the specific interconnection pattern formed from the conductor layer was obtained. FIG. 2 is an optical micrograph of a surface of the conductor layer of the circuit board in Example 1. In FIG. 2, a white (light-colored) band indicates a conductor layer and a black (dense-colored) band indicates a portion where the conductor layer was removed.

Example 2

A circuit board was formed with a method the same as in Example 1 except for use of a glass-ceramics composite substrate as the substrate. The glass-ceramics composite substrate (a trade name "glazed substrate GS-32" manufactured by MARUWA Co., Ltd.) was employed. Namely, this glass-ceramics composite substrate is a substrate containing silicon at least at the surface, with a glass composition containing silicon being formed on the substrate made of ceramics.

Comparative Example 1

A paste was applied, dried, and fired with a method the same as in Example 1, except for use of an alumina substrate (a trade name "ceramic substrate for thick film" manufactured by Phonon Meiwa Inc.) as the substrate. The conductor layer, however, did not have adhesiveness to the substrate but peeled off Therefore, a subsequent experiment could not be conducted. The alumina substrate is a substrate not containing silicon.

Comparative Example 2

A method the same as in Example 1 except for fluoride ions not being added to the etchant was performed. Even after immersion for 1 hour, however, etching did not sufficiently proceed, and it was determined that a circuit could not be formed.

Comparative Example 3

A method the same as in Example 2 was performed except for fluoride ions not being added to the etchant. Even after immersion for 1 hour, however, etching did not sufficiently proceed, and it was determined that a circuit could not be formed.

<Evaluation Method>

Adhesiveness between the conductor layer and the substrate and an insulation resistance were measured for the circuit boards obtained in Examples 1 to 2 and Comparative Examples 1 to 3. Element analysis between the conductor layer and the substrate in the circuit board obtained according to Example 1 was conducted.

(Measurement of Adhesiveness)

Adhesiveness between the conductor layer and the substrate was measured as below. Namely, Sellotape® (a trade name "CT-24" manufactured by Nichiban Co., Ltd.) was stuck to the surface of the conductor layer and pulled at an angle of 45 degrees, and a degree of peel-off of the conductor layer was visually observed. In accordance with a result of observation, absence of peel-off was evaluated as "good" adhesiveness and peel-off was evaluated as "not good" adhesiveness. Table 1 shows results (Measurement of Insulation Resistance)

An insulation resistance was measured as below. Regarding an insulation resistance between a linear conductor layer drawn on the circuit board and a linear conductor layer adjacent thereto, a voltage of 500 V was applied under a condition of 20° C. and a resistance value after 1 minute was measured with a supermegohmmeter (a trade name "SM-8216" manufactured by HIOKI E. E. Corporation). Table 1 shows results. A higher value for the insulation resistance indicates higher reliability in insulation.

TABLE 1

|  |  | Etchant | | | | |
|---|---|---|---|---|---|---|
|  | Substrate | Metal Ions (Compound from which Metal Ions Are Derived) | Addition of Fluoride Ions (Compound from which Fluoride Ions Are Derived) | Adhesiveness | Insulation Resistance ($\Omega$) | Formation of Circuit |
| Example 1 | Soda Lime Glass | Bivalent Copper Ions (Cupric Chloride) | Added (Ammonium Fluoride) | Good | $\geq 10^{12}\ \Omega$ | Yes |
| Example 2 | Glass-Ceramics Composite Substrate | Bivalent Copper Ions (Cupric Chloride) | Added (Ammonium Fluoride) | Good | $\geq 10^{12}\ \Omega$ | Yes |
| Comparative Example 1 | Alumina | Bivalent Copper Ions (Cupric Chloride) | Not Added | Not Good | Not Available | No |
| Comparative Example 2 | Soda Lime Glass | Bivalent Copper Ions (Cupric Chloride) | Not Added | Good | Not Available | No |
| Comparative Example 3 | Glass-Ceramics Composite Substrate | Bivalent Copper Ions (Cupric Chloride) | Not Added | Good | Not Available | No |

<Element Analysis in Direction of Cross-Section>

Figure 3:
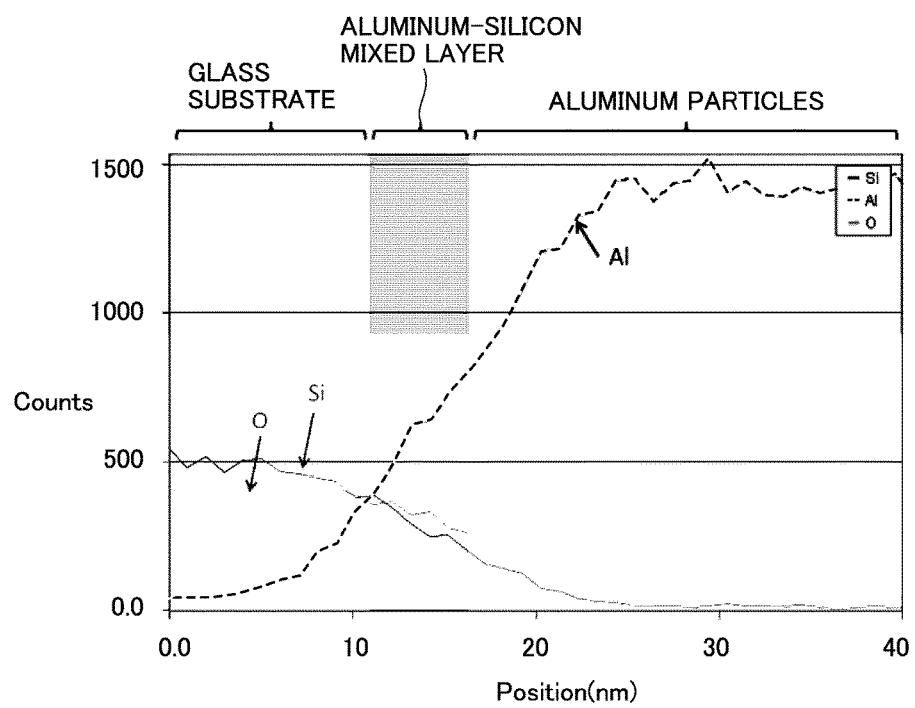
FIG. 3 is a diagram showing a result of element analysis at an interface portion between a conductor layer and a substrate in a cross-section in a perpendicular direction between the conductor layer and the substrate of the circuit board in Example 1.

In order to confirm a mixed layer of aluminum and silicon between the conductor layer and the substrate, the interface between the conductor layer and the substrate was subjected to energy dispersive X-ray spectrometry with the use of an electron microscope (a trade name "TITAN 80-300" manufactured by FEI Company) for a sample according to Example 1. FIG. 3 shows results.

Figure 4:
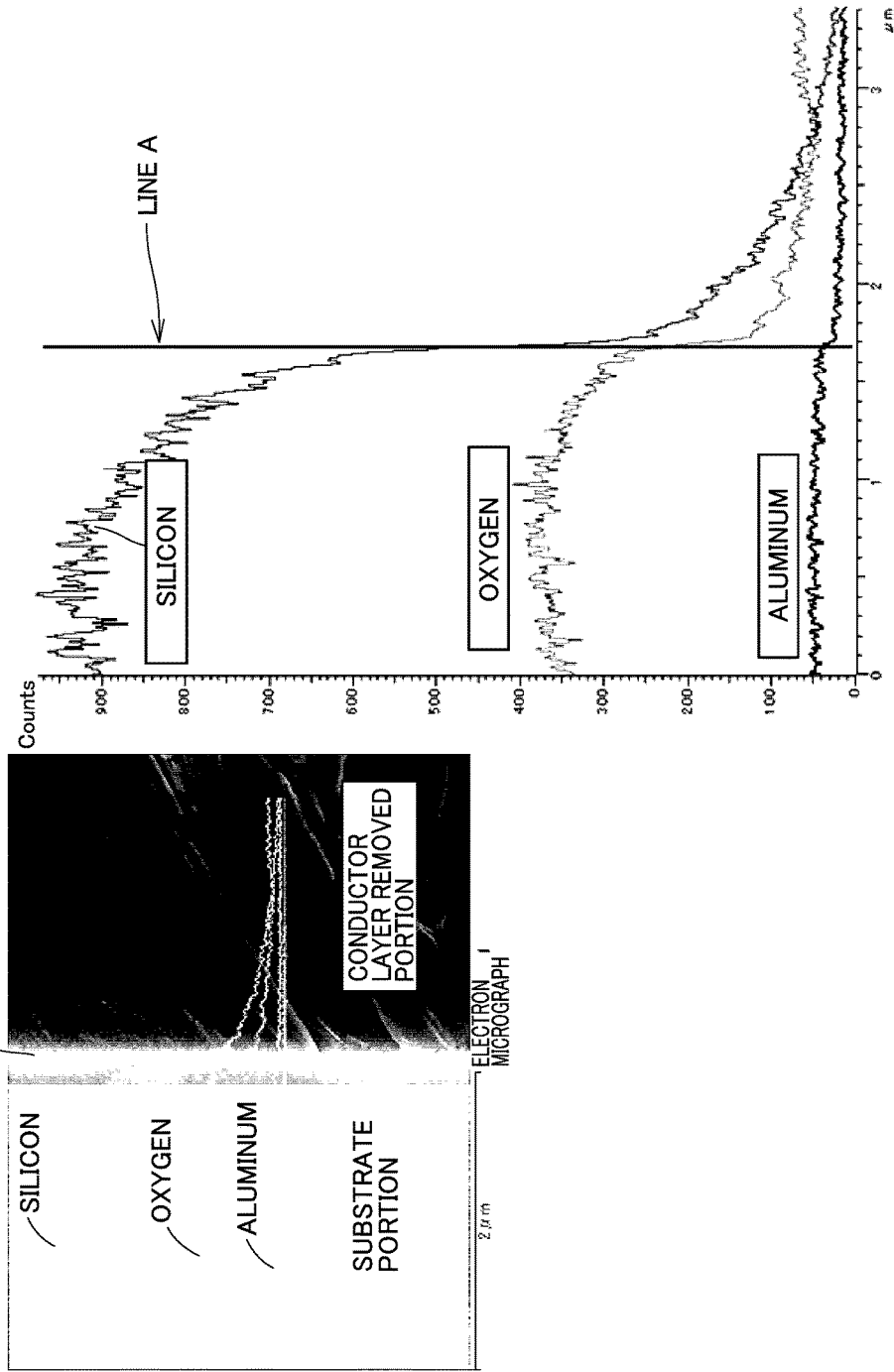
FIG. 4 is a diagram showing a result of element analysis in a portion where the conductor layer has been removed in the cross-section in the perpendicular direction between the conductor layer and the substrate of the circuit board in Example 1.

In order to check presence of aluminum, a content of aluminum, and a peak intensity of the aluminum element and a peak intensity of the silicon element in the substrate surface region in a portion where the conductor layer had been removed, the circuit board according to Example 1 was subjected to EDS analysis using an energy dispersive X-ray analyzer "X-MAX" manufactured by Horiba Ltd. while image observation of the region including the substrate and the substrate surface region in the cross-section in the direction perpendicular to the substrate of the portion where the conductor layer had been removed (a conductor layer removed portion) was conducted at an acceleration voltage of 15 kV with the use of an electron microscope. FIG. 4 shows results. In FIG. 4, in the substrate surface region, the peak intensity of the aluminum element was 40 Counts, the peak intensity of the silicon element was 620 Counts, and the ratio of the peak intensity between the aluminum element and the silicon element (the peak intensity of the aluminum element/the peak intensity of the selection element) was 0.0645. It can be confirmed in FIG. 4 that the substrate surface region and the substrate were equal to each other in the ratio of the peak intensity of aluminum and the peak intensity of aluminum derived from the conductor layer was sufficiently smaller than one tenth of the peak intensity of silicon. Therefore, it was clear that the mixed layer between the substrate and the conductor layer was sufficiently removed in Example 1.

<Evaluation>

(Adhesiveness)

Cells under "adhesiveness" in Table 1 show results of evaluation of adhesiveness between the conductor layer and the substrate of the circuit boards fabricated in Examples and Comparative Examples. Referring to Table 1, it is clear that adhesiveness between the conductor layer and the substrate was evaluated as good and adhesiveness was excellent in Example 1 and Comparative Example 2 in which soda lime glass in which silicon was present at the surface of the substrate was employed and Example 2 and Comparative Example 3 in which the glass-ceramics composite substrate was employed. It is clear that the alumina substrate in Comparative Example 1 not containing silicon at the surface was evaluated as being "not good" in adhesiveness and good adhesiveness between the substrate and the conductor layer was not obtained because the conductor layer peeled off from the substrate after firing of the paste. From the foregoing, it was clarified that adhesiveness between the conductor layer and the substrate could significantly be improved by employing a substrate containing silicon at least at the surface.

(Insulation Resistance)

Cells under "insulation resistance" in Table 1 show results of measurement of an insulation resistance. Referring to Table 1, it is clear that an insulation resistance was not lower than $10^{12}\Omega$ and reliability in insulation was excellent in Examples 1 and 2. In contrast, in Comparative Examples 2 and 3, as described previously, sufficient circuit formation by etching could not be achieved, and hence an insulation resistance between a linear conductor layer and an adjacent linear conductor layer could not be measured. From the foregoing, it was clarified that a circuit board excellent in reliability in insulation without a residue between interconnections could be fabricated by using an etchant to which fluoride ions and metal ions of metal M of which standard electrode potential was higher in value than a standard electrode potential of aluminum had been added.

In Comparative Example 1, adhesiveness between the substrate and the conductor layer was insufficient and the interconnection peeled off. Therefore, an insulation resistance could not be obtained.

(Element Analysis in Direction of Cross-Section)

FIG. 3 shows a result of element analysis at the interface portion between the conductor layer and the substrate in the cross-section in the perpendicular direction between the conductor layer and the substrate of the circuit board in Example 1.

Referring to FIG. 3, a mixed layer in which silicon derived from the glass substrate and aluminum mutually diffused and aluminum and silicon are present as being mixed (denoted as an "aluminum-silicon mixed layer" in FIG. 3) can be observed between the substrate and the conductor layer (aluminum).

From the foregoing, it was clarified that a mixed layer of aluminum and silicon was formed between the conductor layer and the substrate by employing a substrate containing silicon at least at the surface, applying the paste to the substrate, and firing the paste, and hence adhesiveness could significantly be improved.

From the foregoing, it can be seen that Examples 1 and 2 according to the method for manufacturing a circuit board according to the present invention can exhibit an excellent effect of achieving both of high adhesiveness between the substrate and the conductor layer and easy removal of a residue after etching while an advantage of a method by etching allowing formation of a circuit with high precision is made use of Though the embodiment and the examples of the present invention have been described above, combination of features in each embodiment and example described above as appropriate is also originally intended.

It should be understood that the embodiment and the examples disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

1 glass-ceramics composite substrate; 2 ceramic substrate; 3 glass composition containing silicon; 4 paste; 5 conductor layer; 6 resist film; 7 optically transparent portion; and 8 photomask.

The invention claimed is:

1. A circuit board, comprising:
a substrate containing silicon at least at a surface;
a conductor layer containing aluminum, which is formed on the substrate; and
a mixed layer in which aluminum and silicon are present as being mixed, which is formed at an interface between the substrate and the conductor layer,
the substrate having a portion where the conductor layer has partially been removed such that the conductor layer forms a specific interconnection pattern on the substrate, and in a cross-section in a direction perpendicular to the substrate, a ratio between a peak intensity found in energy dispersive X-ray analysis of an aluminum element derived from the conductor layer and a peak intensity found in energy dispersive X-ray analysis of a silicon element (a peak intensity of an aluminum element/a peak intensity of a silicon element) in a surface region of the substrate in the portion where the conductor layer has partially been removed being not more than one tenth, wherein the surface of the substrate consists of a glass composition containing silicon.

2. The circuit board according to claim 1, wherein a content of the aluminum element in the surface region of the substrate is not higher than 1000 ppm.

3. The circuit board according to claim 1, wherein the mixed layer has a region of 5 nm or more where a value for detection of aluminum is not less than one tenth of a value for the detection of aluminum in the conductor layer and simultaneously a value for the detection of silicon is not less than one tenth of a value for detection of silicon in the substrate, in the case of observing change in concentration of aluminum and silicon at an interface between the conductor layer and the substrate by conducting energy dispersive X-ray spectrometry using an electron microscope on an observation region including the conductor layer and the substrate in the cross-section in the direction perpendicular to the substrate.

4. The circuit board according to claim 1, wherein a thickness of the mixed layer is from 0.005 μm to 10 μm.

* * * * *